United States Patent
Riou et al.

(10) Patent No.: US 6,704,551 B2
(45) Date of Patent: Mar. 9, 2004

(54) CALIBRATION OF IN-PHASE AND QUADRATURE TRANSMIT BRANCHES OF A TRANSMITTER

(75) Inventors: Emmanuel Riou, Santa Clara, CA (US); Willhelm Steffen Hahn, Los Altos, CA (US); Axel Erich Schuur, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 586 days.

(21) Appl. No.: 09/792,148

(22) Filed: Feb. 21, 2001

(65) Prior Publication Data

US 2002/0115416 A1 Aug. 22, 2002

(51) Int. Cl.$^7$ ................................................ H03C 1/62
(52) U.S. Cl. .................... 455/115.1; 455/114.2; 455/115.2; 375/224; 375/296
(58) Field of Search .................. 455/115.1, 295, 455/91, 39, 115.2, 114.2, 126, 116, 67.11, 67.14, 67.13, 293; 375/224, 295, 296; 332/108, 119, 151, 103

(56) References Cited

U.S. PATENT DOCUMENTS

| | | | | |
|---|---|---|---|---|
| 6,058,291 A | * | 5/2000 | Ketcham | 455/46 |
| 6,265,949 B1 | * | 7/2001 | Oh | 332/103 |
| 6,421,397 B1 | * | 7/2002 | McVey | 375/308 |
| 6,421,398 B1 | * | 7/2002 | McVey | 375/308 |
| 6,574,286 B2 | * | 6/2003 | McVey | 375/308 |
| 6,625,424 B1 | * | 9/2003 | Mohindra | 455/84 |
| 2003/0095607 A1 | * | 5/2003 | Huang et al. | 375/296 |

* cited by examiner

Primary Examiner—Sonny Trinh
(74) Attorney, Agent, or Firm—Arron Waxer

(57) ABSTRACT

In a method of calibrating a quadrature transmitter, a first calibration signal is injected into an in-phase transmit branch of the quadrature transmitter, and a second calibration signal is injected into a quadrature transmit branch of the quadrature transmitter. The first and second calibration signals are injected before performing up-conversion in the transmitter and are produced by first and second digital signals. A detector detects an up-converted signal. The detected up-converted signal is digitized. The in-phase and quadrature transmit branches are calibrated by alternately determining the first and second calibration signals while at least varying respective most significant bits of the first and second digital signals, upon said varying the at least most significant bits keeping calibration bit values that correspond to minimum values of the digitized detected up-converted signal.

15 Claims, 4 Drawing Sheets

CALIBRATION OF IN-PHASE AND QUADRATURE TRANSMIT BRANCHES OF A TRANSMITTER

BACKGROUND OF THE INVENTION

1. Field of the Invention

The present invention relates to calibration of in-phase and quadrature branches of a quadrature transmitter or transceiver, such transmitter or transceivers being based on a zero-IF or low-IF architecture. Such transmitters or transceivers can devices under the s-called IEEE 802.11a or IEEE 802.11b Standard, can be cell phones, or can be any other suitable radio frequency device.

2. Description of the Related Art

Transmitters or transceivers based on a zero-IF (Intermediate Frequency) or low-IF architecture are well-known in the art. Such transmitters have an in-phase and quadrature transmit branch and an up-converter to up-convert a base band signal to a radio frequency signal, typically by a pair of quadrature mixers. Such zero-IF or low-IF transmitters are usually implemented as an integrated circuit on a chip. Due to asymmetrical layout of diverse components of the transmitter on the chip, such as off-center positioning of transmit filters or other components, mismatch occurs. Such a mismatch produces DC-offsets in the transmit branches, before up-conversion, an herewith undesired local oscillator (LO) components in up-converted signals. Such unwanted LO components, also known as LO-feedthrough, might be of such a severe nature, depending on component and IC-process spread, that customer requirements can no longer be fulfilled.

SUMMARY OF THE INVENTION

It is an object of the invention to provide an effective and optimal method of calibrating a quadrature transmitter.

In accordance with the invention, a method of calibrating a quadrature transmitter is provided, said method comprising:

injecting a first calibration signal into an in-phase transmit branch of said quadrature transmitter;

injecting a second calibration signal into a quadrature transmit branch of said quadrature transmitter, said first and second calibration signals being injected before performing up-conversion in said transmitter and being produced by respective first and second digital signals;

detecting an up-converted signal;

digitizing said detected up-converted signal; and calibrating said in-phase and quadrature transmit branches by alternately determining said first and second calibration signals while at least varying respective most significant bits of said first and second digital signals, upon said varying said at least most significant bits keeping calibration bit values that correspond to minimum values of said digitized detected up-converted signal.

The invention is based on the insight to first and quickly remove large errors, such as a major part of DC-offset errors, in in-phase and quadrature transmit branches, thereby avoiding otherwise unnecessary repetitious calibration cycles.

Preferably and very advantageously, an alternating transmit branch calibration scheme, as applied to the most significant bits of the digital signals that produce the calibration signals, is also and successively applied to less significant bits of the digital signals.

In order to check whether a still better calibration result may be obtained, neighboring values of a determined calibration signal are tried, and the best result of such a check is taken as the final calibration signal.

In case of a low-IF transmitter architecture, a single tone calibration signal is input to the transmitter, and a filter is arranged before the detector so as to filter out an up-converted tone signal and to suppress a local oscillator signal.

BRIEF DESCRIPTION OF THE DRAWING

Throughout the figures the same reference numerals are used for the same features.

DESCRIPTION OF THE DETAILED EMBODIMENTS

Figure 1:
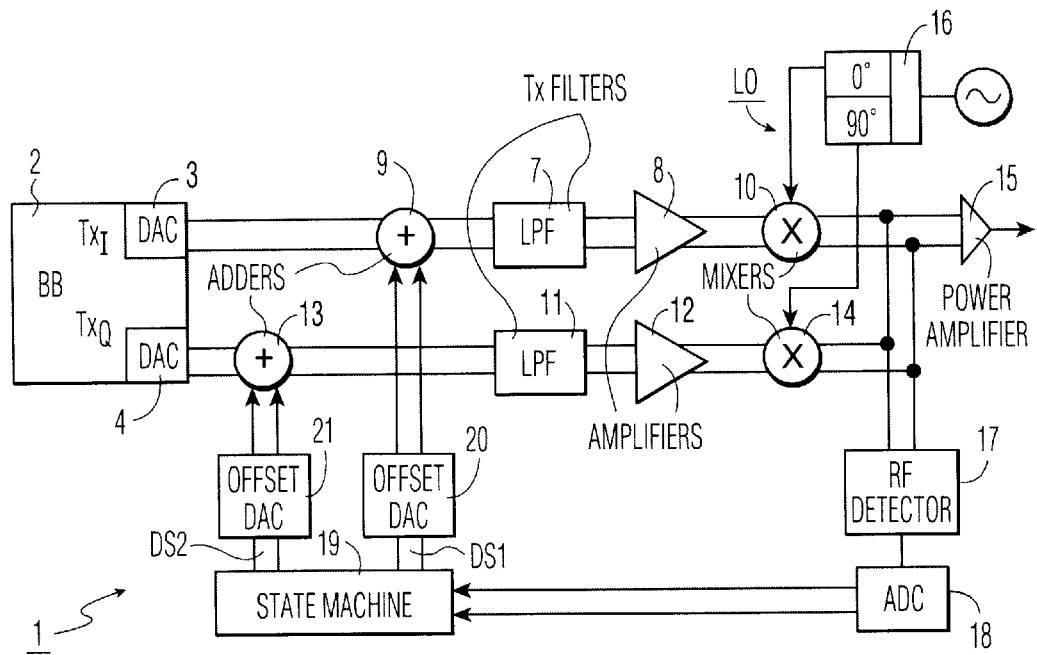
FIG. 1 is block diagram of a quadrature transmitter according to the invention.

FIG. 1 is block diagram of a quadrature transmitter 1 according to the invention. The transmitter 1 comprises a base band circuit or chip 2 that, through digital-to-analog converters (DAC) 3 and 4 respective base band transmit signals $Tx_I$ and $Tx_Q$ to an in-phase transmit branch 5 and a quadrature transmit branch 6. The in-phase transmit branch 5 comprises a low pass transmit filter 7, and amplifier 8, an injector or adder 9 and a mixer 10. The quadrature transmit branch 6 comprises a low pass transmit filter 11, an amplifier 12, an injector or adder 13 and a mixer 14. Output signals of the mixers 10 and 14 are combined and provided to a transmit power amplifier 15. A local oscillator circuit or synthesizer 16, including a 90° phase shifter for the quadrature transmit branch 6, provides local oscillator signals to up-convert the base band transmit signal. In case of a zero-IF transmitter architecture, transmitter calibration is performed with the transmit base band signal being absent. In case of a low-IF transmitter architecture, transmitter calibration is performed with a single tone base band signal. The transmitter may be included in a transceiver that further has a receiver. In the example given, two quadrature mixers 10 and 14 are provided for up-conversion of the base band signal. Any other suitable quadrature transmitter architecture may be applied, including transmitter architectures that exhibit multiple up-conversion stages. The injectors 9 and 13 preferably are directly coupled to the digital-to-analog converters 3 and 4. Alternatively, the injectors 3 and 4 may be configured further upstream the in-phase and quadrature transmit branches, before the mixers 10 and 14.

For calibration purposes, the transmitter 1 further comprises an RF detector 17 that detects an RF signal at the output of the mixers 10 and 14, an analog-to-digital converter 18 that digitizes the detected up-converted signal, a state machine 19 that implements the calibration algorithm, and digital-to-analog converters 20 and 21 that provide respective calibration signals to the injectors 9 and 13. The state machine 19 may be implemented as synthesized logic. Such synthesized logic is produced by a gate level net list generated by a synthesizing tool that is supplied with hardware description language code. The hardware description language code comprises the calibration algorithm.

Alternatively, the state machine 19 may at least partly be implemented on a processor or as programmable logic, or any other suitable means to implement the calibration algorithm. The digital-to-analog converters 20 and 21 produce the calibration signals from respective digital signals DS1 and DS2 that are provided by the state machine 19. The embodiment of the state machine 19 that uses synthesized logic is very useful for very high frequency implementations, e.g., at 2.4 GHz or even 5.0 GHz or still higher. The embodiment of the state machine 19 applying a processor can be used for substantially lower frequency transmitters. The RF detector 17 has an output voltage range of 0–2 Volts, for instance. The digital-to-analog converters 20 and 21, e.g. 5 bit converters, provide an output current in the range $-20\ \mu A$ to $+20\ \mu A$, for instance, i.e., a positive or a negative output. Alternative, the digital-to-analog converters may provide an output current in the range $0\ \mu A$ to $+40\ \mu A$, i.e, a positive output current only. Other word length or output currents may apply. The calibration signals by and large are DC-offset compensation signals, but, because of the feedback loop character of the calibration also compensate for other mismatches.

Figure 2:
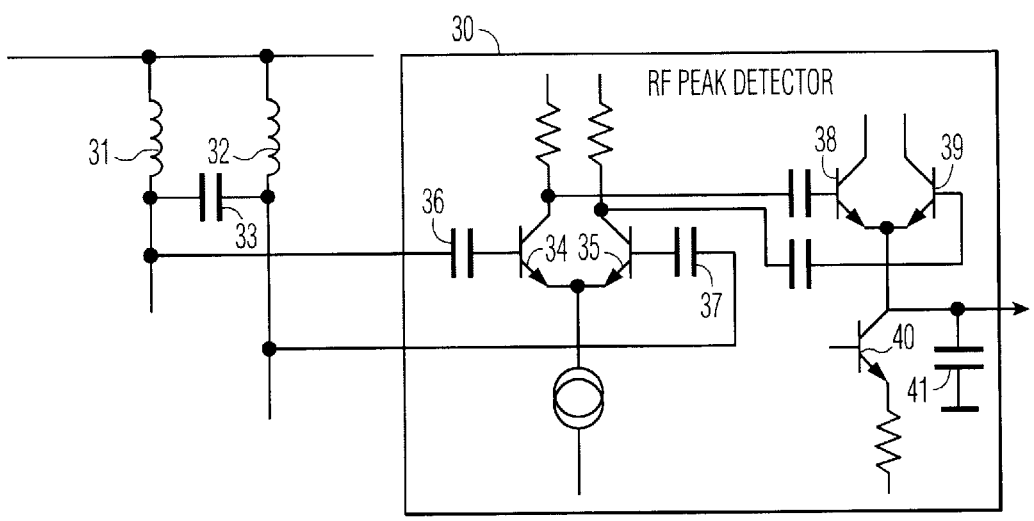
FIG. 2 is a circuit diagram of an RF peak detector.

FIG. 2 is a circuit diagram of an RF peak detector 30 that detects an up-converted signal. The RF peak detector is coupled to a tank circuit of the local oscillator 16, the tank circuit comprising inductors 31 and 32 and capacitor 33. The RF peak detector 30 comprises a first stage of a balanced pair of transistors 34 and 35 that is AC-coupled, through capacitors 36 and 37 to the tank circuit. The balanced pair is AC-coupled to another balanced pair of transistors 38 and 39 in a tail of which a transistor 40 provides a double rectified signal to a capacitor 41 that provides a smoothed double rectified output signal of the RF detector 30. Taking into account the relationship $CV=I/f$, C being capacity, V being voltage, I being current, and f being a high frequency, e.g. 2.4 GHz, the capacitor value is chosen such that I is a very low current.

Figure 3:
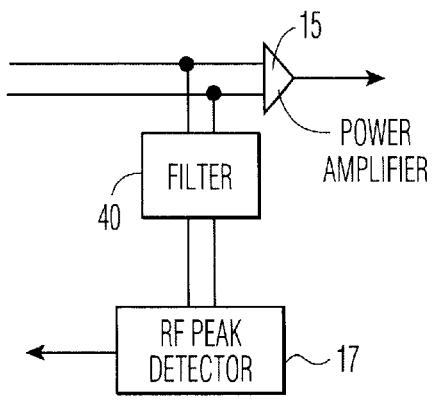
FIG. 3 is a block diagram of part of the transmitter showing detection using a filter and an RF peak detector.

FIG. 3 is a block diagram of part of transmitter showing detection using a filter 40 and the RF peak detector 17. The filter 40 passes the signal to be detected and suppresses the local oscillator signal. In this embodiment, the transmitter has a low-IF architecture.

Both in zero-IF and low-IF transmitter architectures, calibration eventually achieves minimum detector output signals. In the calibration procedure, three main functions are distinguished, determining a sign of the offset, determining magnitudes of the offset compensation signals, and checking neighbor offset values for better results.

Figure 4:
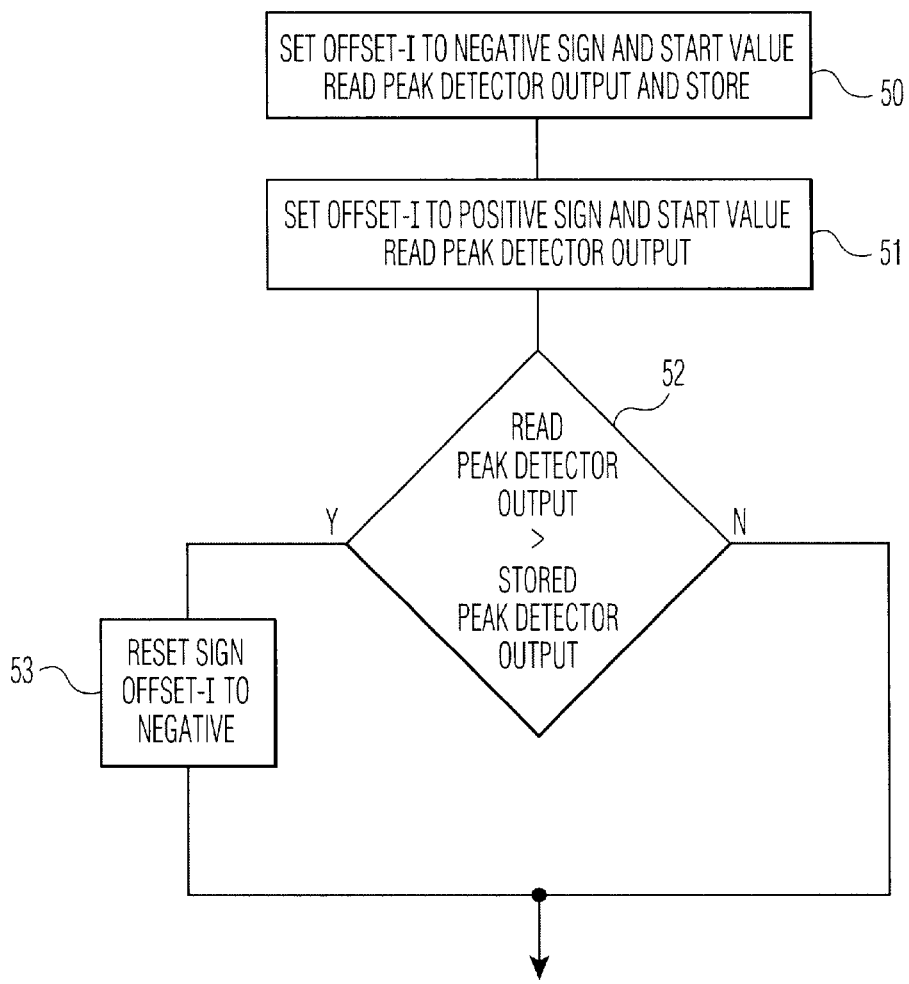
FIG. 4 is a first flow-chart illustrating the invention.

FIG. 4 is a first flow-chart illustrating the invention, showing determining a sign of the offset. In block 50, the sign of either one of the offset signals, the digital signals DS1 and DS2, is set to a negative sign value, in the example given for the in-phase transmit branch (Offset-I). Offset_I is also give a calibration start value. Alternatively, sign setting may first be done for the quadrature transmit branch. Further, the detector output is read and, after digitizing, stored in a memory element of the gate logic. Such a memory element typically is formed by a couple of flip-flops. Then, in block 51, Offset-I is set to a positive sign value and to the calibration start value, and the detector output is read again. In block 52 it is tested whether the last read peak detector output is greater than the previously stored peak detector output. If so, in block 53, the sign of Offset-I is reset to a negative sign value. The above procedure is repeated for Offset-Q, or, if had first been started with Offset-Q, for Offset-I.

Figure 5:
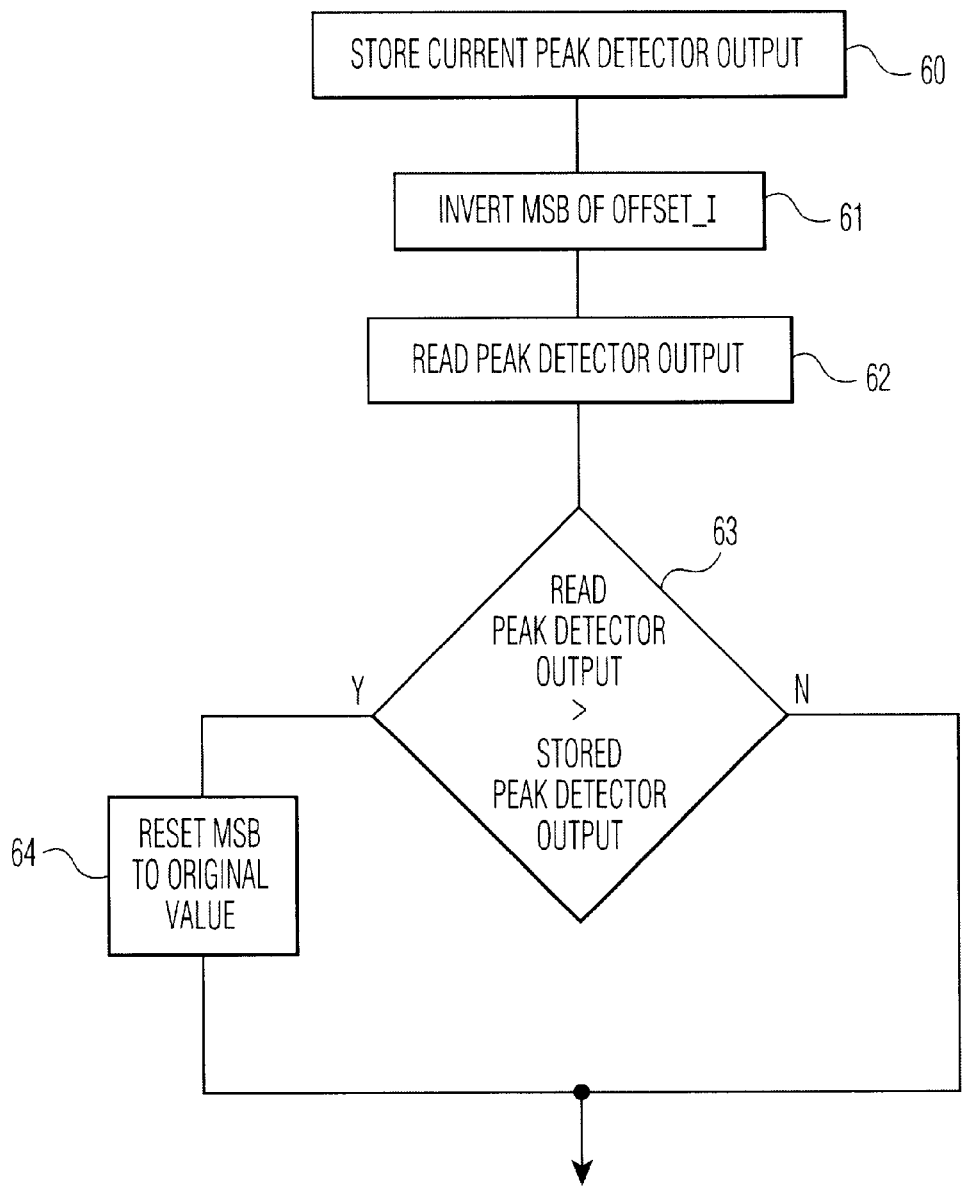
FIG. 5 is a second flow-chart illustrating the invention.

FIG. 5 is a second flow-chart illustrating the invention, showing determining magnitudes of the offset compensation signals. In block 60, a currently read detector output is stored. Then, in block 61, the most significant bit (MSB) of Offset-I is inverted, and in block 62 the detector output is read again. In block 63 it is tested whether the last read peak detector output is greater than the previously stored peak detector output. If so, in block 64 the most significant bit of Offset-I is reset ti its original value, the value it had before inversion. The above procedure is repeated for Offset-Q. The procedure could have started with Offset-Q, then Offset-I, instead. Preferably, the above procedure is successively repeated for the less significant bits of Offset-I and Offset-Q, bits MSB-1 through LSB (Least Significant Bit), thereby for each bit alternating between the I-branch and the Q-branch of the transmitter.

In view of the above, the invention can thus generally be characterized in that for each calibration step alternated is between the I-channel and the Q-channel of the transmitter. Such an approach is very time efficient because it avoids unnecessary repetitive calibration steps. An further in that a search-and-compare mechanism is provided that applies bit-toggling to find an optimum. Such an implementation is compact and still guarantees that a full search range is covered needed for offset compensation.

Sub-optimal schemes may be applied for setting the digital signals DS1 and DS2, as long as at least the described bit toggle mechanism is applied for the MSB so as to remove large offset error. Examples of such sub-optimal schemes are:
a. First all bits of the I-channel, then all bits of the Q-channel.
b. Alternate for MSB of I-channel and Q-channel, then all further bits of the I-channel, then all further bits of the Q-channel.
c. Alternate for MSB and MSB-1 for the I-channel and the Q-channel, then all further bits of the I channel, then all further bits of the Q-channel.

Where no alternation is applied, still calibration repetition cycles are needed.

Figure 6:
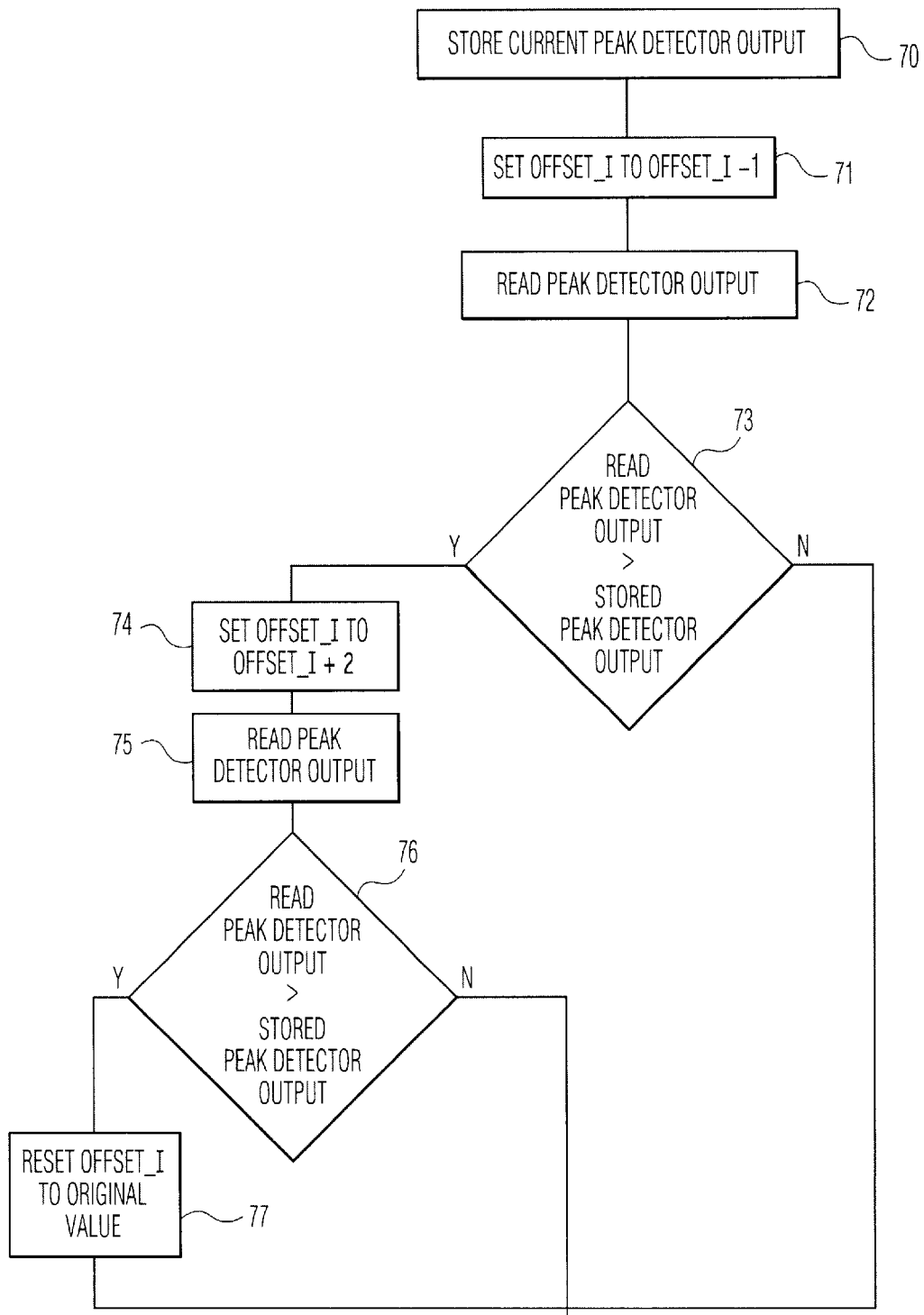
FIG. 6 is a third flow-chart illustrating the invention.

FIG. 6 is a third flow-chart illustrating the invention, showing checking of neighbor offset values for better results. In block 70, a current detector output is stored. In block 71, Offset-I is set to Offset-I minus one. In block 72, the detector output is read again. In block 73 it is tested whether the last read detector output is greater than the previously stored detector output. If so, in block 74, Offset-I is set to Offset-I minus two. Then, in block 76, it is tested whether the last read peak detector output is greater than the previously stored detector output. If so, in block 77, Offset-I is set to its original value, i.e., the value it had before neighbor checking. The above procedure is repeated for Offset-Q.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A method of calibrating a quadrature transmitter, said method comprising:
   injecting a first calibration signal into an in-phase transmit branch of said quadrature transmitter;
   injecting a second calibration signal into a quadrature transmit branch of said quadrature transmitter, said first and second calibration signals being injected before performing up-conversion in said transmitter and being produced by respective first and second digital signals;

detecting an up-converted signal;

digitizing said detected up-converted signal; and calibrating said in-phase and quadrature transmit branches by alternately determining said first and second calibration signals while at least varying respective most significant bits of said first and second digital signals, upon said varying said at least most significant bits keeping calibration bit values that correspond to minimum values of said digitized detected up-converted signal.

2. A method as claimed in claim 1, therein further calibrating said in-phase and quadrature transmit branches by repeating said alternatively determining of said first and second calibration signals for less significant bit settings of said first and second digital signals, thereby successively varying said less significant bit settings, in order of significance, and successively keeping calibration bit values that correspond to minimum values of said digitized detected up-converted signal.

3. A method as claimed in claim 1, therein first determining respective signs of said first and second digital signals, by respectively setting said first and second digital signals to start values and correspondingly first and second sign values, and keeping sign values for which said digitized detected up-converted signal is minimal.

4. A method as claimed in claim 1, therein further calibrating said in-phase and quadrature transmit branches by checking for neighboring values of said first and second digital signals whether there is a better than an initially found optimum calibration, thereby keeping from initially determined first and second digital values of said first and second digital signals, and from neighboring digital values of said first and second digital signals, digital values for which said digitized detected up-converted signal is minimal.

5. A transmitter comprising:

an in-phase transmit branch with first mixer means and first injecting means for injecting a first calibration signal at an input side of said first mixer means;

a quadrature transmit branch with second mixer means and second injecting means for injecting a second calibration signal at an input side of said second mixer means, said first and second mixer means being configured to up-convert a base band transmit signal to an up-converted signal, and said first and second calibration signals being produced by respective first and second digital signals;

detector means for detecting the up-converted signal;

digitizer means for digitizing said detected up-converted signal; and state machine means for calibrating said in-phase and quadrature transmit branches by alternately determining said first and second calibration signals while at least varying respective most significant bits of said first and second digital signals, upon said varying said at least most significant bits keeping calibration bit values that correspond to minimum values of said digitized detected up-converted signal.

6. A transmitter as claimed in claim 5, said state machine means being configured to further calibrate said in-phase and quadrature transmit branches by repeating said alternatively determining of said first and second calibration signals for less significant bit settings of said first and second digital signals, thereby successively varying said less significant bit settings, in order of significance, and successively keeping calibration bit values that correspond to minimum values of said digitized detected up-converted signal.

7. A transmitter as claimed in claim 5, wherein said state machine means is configured to first determine respective signs of said first and second digital signals, by respectively setting said first and second digital signals to start values and correspondingly first and second sign values, and keeping sign values for which said digitized detected up-converted signal is minimal.

8. A transmitter as claimed in claim 5, wherein said state machine means is configured to further calibrate said in-phase and quadrature transmit branches by checking for neighboring values of said first and second digital signals whether there is a better than an initially found optimum calibration, thereby keeping from initially determined first and second digital values of said first and second digital signals, and from neighboring digital values of said first and second digital signals, digital values for which said digitized detected up-converted signal is minimal.

9. A transmitter as claimed in claim 5, further comprising first digital-to-analog converter means and second digital-to-analog converter means, said first and second digital-to-analog converters means being coupled between said state machine means and said first and second injecting means, and said first and second digital-to-analog converter means being configured to produce said first and second calibration signals.

10. A transmitter as claimed in claim 5, wherein said detector means is a radio frequency detector that is AC-coupled to said in-phase and quadrature transmit branches and that produces a smoothed full-wave rectified detector output signal.

11. A transmitter as claimed in claim 5, said transmitter being a zero-IF transmitter, and said calibration being performed in absence of said base band transmit signal.

12. A transmitter as claimed in claim 5, said transmitter being a low-IF transmitter that further comprises a filter that receives said up-converted signal and that provides a filtered signal to said detector means, said calibration being performed with said base band signal being a single frequency tone signal, said filter being configured to pass an up-converted replica of said tone signal and to suppress a local oscillator signal provided to said first and second mixer means.

13. A transmitter as claimed in claim 5, wherein said digitizer means is an analog-to-digital converter.

14. A transmitter as claimed in claim 5, wherein said state machine means comprises synthesized logic.

15. A transceiver with a transmitter, said transmitter comprising:

an in-phase transmit branch with first mixer means and first injecting means for injecting a first calibration signal at an input side of said first mixer means;

a quadrature transmit branch with second mixer means and second injecting means for injecting a second calibration signal at an input side of said second mixer means, said first an second mixer means being configured to up-convert a base band transmit signal to an up-converted signal, and said first and second calibration signals being produced by respective first and second digital signals;

detector means for detecting the up-converted signal;

digitizer means for digitizing said detected up-converted signal; and state machine means for calibrating said in-phase and quadrature transmit branches by alternately determining said first and second calibration signals while at least varying respective most significant bits of said first and second digital signals, upon said varying said at least most significant bits keeping calibration bit values that correspond to minimum values of said digitized detected up-converted signal.

* * * * *